United States Patent [19]

Narihiro et al.

[11] 4,043,206
[45] Aug. 23, 1977

[54] CHANNEL SELECTING SHAFT MOUNTING ARRANGEMENT FOR UHF TUNERS

[75] Inventors: Michiaki Narihiro; Akira Nishimura, both of Ueno, Japan

[73] Assignee: New Nippon Electric Company, Ltd., Osaka, Japan

[21] Appl. No.: 568,302

[22] Filed: Apr. 15, 1975

[30] Foreign Application Priority Data

Apr. 18, 1974 Japan .................................. 49-44524

[51] Int. Cl.$^2$ ............................................ F16H 35/18
[52] U.S. Cl. ................................ 74/10.54; 74/102; 74/10.41; 64/30 LB; 192/67 R; 116/124.1 R
[58] Field of Search ............... 74/10.54, 10.50, 10.41, 74/10.8, 10 R, 10.2; 64/30 A, 30 LB; 192/67; 116/124.1, 124.2, 124.3

[56] References Cited
U.S. PATENT DOCUMENTS

| | | | |
|---|---|---|---|
| 2,046,910 | 10/1936 | Barrett | 74/10.54 |
| 2,643,531 | 6/1953 | Hayes | 64/30 LB |
| 2,655,811 | 10/1953 | Behrens | 74/10.54 |
| 3,333,477 | 8/1967 | Denkowski | 74/10.2 |
| 3,774,459 | 11/1973 | Valdettaro | 74/10.41 |
| 3,844,176 | 10/1974 | Valdettaro | 74/10.54 |

*Primary Examiner*—Samuel Scott
*Assistant Examiner*—Randall Heald
*Attorney, Agent, or Firm*—W. G. Fasse; W. W. Roberts

[57] ABSTRACT

In arrangement of a channel selecting device used for a UHF tuner of the continuously variable type, a taper clutch is employed for transmitting the rotation of the detented selector shaft to the output drive gear which is secured to the fine tuning shaft positioned inside the selector shaft. The taper clutch is formed by engagement of the annular inner surface of a hollow portion in the end of the selector shaft and the annular outer surface of a hub member of the fine tuning shaft, each of surfaces has a taper angle ($2\theta$) in the range of about 20° to 9° to frictionally couple the selector shaft and the drive gear, and is coated with a layer of lubricant materials to permit the rotation of the fine tuning shaft independent of the selector shaft. This taper clutch provides stable and smooth operation in the extended temperature range and without any undesired creep between the selector shaft and the fine tuning shaft.

15 Claims, 4 Drawing Figures

CHANNEL SELECTING SHAFT MOUNTING ARRANGEMENT FOR UHF TUNERS

BACKGROUND OF THE INVENTION

The present invention relates to UHF tuners, and more particularly, to UHF tuners of the type which are arranged to provide a separately detented position of the selected shaft for each of the UHF stations in the UHF television band.

Various arrangements have been heretofore proposed in conjunction with a UHF tuner of the continuously variable type to provide a separately detented position for the selector shaft of the UHF tuner for each one of the sevently UHF stations in the UHF television band. One such arrangement is shown, for example, in U.S. Pat. No. 3,774,459 wherein the selector shaft is mounted in the front wall of a bracket, and the fine tuning shaft positioned inside the station selector shaft is mounted on a rear wall of the bracket. The detent positions are established by means of a detent spring which engages detent lobes formed integrally with the selector shaft at a point intermediate the two supporting walls of the bracket. This detent spring exerts a side thrust on the rear end of the selector which is supported indirectly through the central fine tuning shaft.

There is a problem in such arrangement that if a large tolerance is employed between the station selector shaft and the central fine tuning shaft, the side thrust exerted by the detent spring on the rear end of the selector shaft causes the selector shaft to be slightly eccentric with respect to the fine tuning shaft and the clutch plate carried thereby. Under these conditions an action which may be termed "creep" is produced when the selector shaft is rotated through a number of revolutions as it is when traveling from one end to the UHF television band to the other. This "creep" between the selector shaft and the output gear which is carried by and secured to the fine tuning shaft affects the overall alignment accuracy curve of the UHF tuner since the gear connected to the fine tuning shaft drives the rotor of the continuously variable UHF tuner through a spring loaded gear train. For eliminating such creep action, U.S. Pat. No. 3,844,176 discloses the use of the low friction plastic washer being in the severed play or tolerance. The washer needs to have an inner diameter closely fitting with the fine tuning shaft and an outer diameter closely fitting with the selector shaft. However, the above resolution needs a new preparation of washer part for mounting and still requests a small amount of play for the arrangement. Therefore, it is requested to propose a new and improved method for resolution of such problem by reducing the number of parts in the arrangement and achieving easily mounting operation.

Meanwhile, channel selecting operation in such UHF tuner must be achieved easily and stably by the operator who gives necessary torques to the selector shaft or the fine tuning shaft. Magnitudes of these torques which are concerned with the diameter of operating knobs are predetermined so as to make suitable operation, and are generally selected within ranges of 1.5 to 5.0 kilogram-centimeters for the detent selector shaft and 0.5 to 2.5 kilogram-centimeters for the fine tuning shaft. Usually it is preferred that the torque of the selector shaft is in about 2.5 kilogram-centimeters for obtaining the detent effect and the torque of the fine tuning shaft is in about 0.8 kilogram-centimeters for obtaining stable and smooth rotation of the fine tuning shaft. Since clutching means must be effectively actuated by these torques, the conventional clutch employes a clutch pad intermediate the clutching surfaces for establishing suitable friction therebetween as well as the use of lubricant agents, such as of high velocity oil for reducing the differential of dynamic and static torques. The use of the clutch pad causes other problems and one of disadvantages in the above clutch is to vary the coefficient of friction due to temperatures, for instance, by rising temperature the velocity of lubricant oil is reduced so that the necessary torque for fine tuning operation may be unsteady by reducing the coefficient of friction of the clutch. Therefore, it is requested to propose an improved clutch for the channel selecting shaft mounting arrangement, which is relatively inexpensive and performs operation characteristic to be smooth and stable.

Further, there is a manufacturing problem of counter stopping means in the combination disclosed in the above mentioned U.S. Pat. No. 3,774,459 that for determining location of the stopping lug on the selector shaft, the different selector shaft must be prepared for different channel plans in each countries and therefore, it is requested to provide an improved counter stopping means in which the location of the stop lug is changeable due to the channel plan in different countries, such as seventy positions in U.S. and fifty positions in Japan.

SUMMARY OF THE INVENTION

In view of the foregoing, it is a main object of the present invention to provide a new and improved channel selecting shaft mounting arrangement for UHF tuners, in which the clutching means is formed by a taper clutch.

Another object of the present invention is to provide a new and improved tuner drive mechanism having a taper clutch for transmitting rotation of the selector shaft to the drive gear and a tapered bearing portion for supporting the fine tuning shaft with stability and smoothness.

A still another object of the present invention is to provide a taper clutch for the tuner shaft mounting arrangement, of which each of taper clutch faces is coated with solid lubricant materials, and has a suitable taper angle in the predetermined range.

A further object of present invention is to provide an improved counter stopping means for the tuner shaft mounting aggangement, which is characterized by using a ring member having a knurled inside face for adapting to engage with the knurled portion of the selector shaft.

These and other objects, advantages and features are attained in accordance with the principles of the present invention, by a tuner shaft mounting arrangement for UHF tuner of the continuously variable type, which comprises in combination; a UHF tuner having a continuously variable main tuning shaft; a selector shaft provide with a series of detent lobes on the periphery and a recess in the rear end thereof; a detent biasing means for establishing a plurality of equally spaced detent positions for said selector shaft; a fine tuning shaft positioned inside said selector shaft; a hub member secured to said fine tuning shaft and having an output drive gear; a series of gear trains for interconnecting the output drive gear and the main tuning shaft; a taper clutch formed by the inner surface of the recess in the selector shaft and the outer surface of the hub member on the fine tuning shaft; and spring means for exerting a force along the axes of the both shafts tending bias said inner and outer surfaces of the taper clutch so as to eliminate misalignment of the selector shaft with respect to the fine tuning shaft. For counting the selected channels, it is also added the counter mechanism with counter stopping means comprising a ring-shaped stop member defining a limit stop, an annular arming cam member on the selector shaft, means for ratating the arming cam member, a stop being engageable to the ring-shaped stop member and the arming cam member, and means for biasing the stop lever for engagement.

In other words, it is disclosed that the arrangement of a channel selecting device used for a UHF tuner of the continuously variable type characterized by using a taper clutch which is employed for transmitting the rotation of the detented selector shaft to the output drive gear for eliminating creep action due to any play or torerance between the selector shaft and the fine shaft positioned inside the selector shaft. The taper clutch is formed by engagement of the annular inner surface of a hollow portion in the end of the selector shaft and the annular outer surface of a hub member of the fine tuning shaft, each of surfaces has a taper angle $2\theta$ in the rage of about 20° to 90° to frictionally couple the selector shaft and the drive gear.

It has been found by the inventors that when the taper angle $2\theta$ is below 20°, a large torque for the fine tuning shaft is required for fine tuning shaft is required for fine tuning operations due to clinging of the fine tuning shaft to the selector shaft, and that when the taper angle is above 90°, a large force for clutch biasing means is required and/or a clutch frictional pad is needed to obtain a desired clutch function, and that it is preferable to use in the range from 40° to 70°.

As an improvement, each surfaces of the taper clutch is coated with a layer of lubricant materials, such as by spraying of fluorine-contained resin and/or molybdenum disulfide so as to provide stable and smooth operation in the extended temperatures range and without any undesired creep between the selector shaft and the fine tuning shaft. It is noted that the lubricant layer extends the lower limit of the taper angle. Since the lower taper angle produces a large friction in the taper clutch and therefore the force of the clutch biasing means is reduced, such structure of shaft mounting arrangement is more desirable for obtaining lightly and easily rotational operation of the fine tuning shaft. Additionally, the improvement of the end bearing portion of the fine tuning shaft is achieved by engagement of a tapered surface of the end bearing portion and the conical-shaped rearwardly directed flange of a bracket.

Further improvement of the shaft mounting arrangement is also disclosed in regards to the counter stopping means which is characterized by using the ring-shaped member removably fixed on the selector shaft for adjusting the stopping position of a limit stop on the ring-shaped member.

In accordance with the present invention, a number of necessary parts for tuner drive mechanism may be reduced without accompanying any demerits, and ecomomical arrangement for tuner drive mechanism may be provided.

DESCRIPTION OF THE PREFERRED EMBODIMENT

Figure 1:
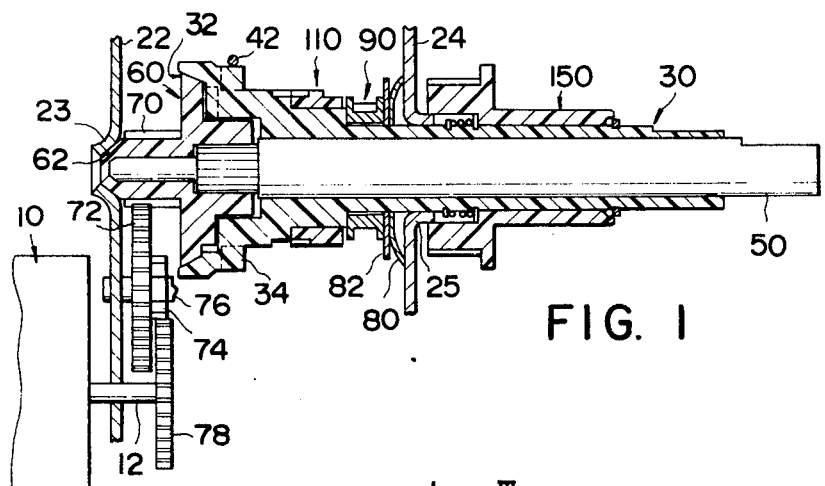
FIG. 1 is a cross sectional view of a tuner shaft mounting arrangement in accordance with the present invention.
Figure 2:
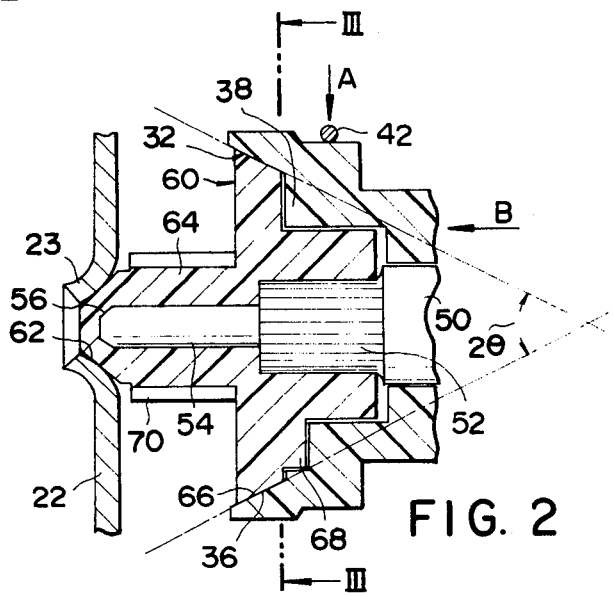
FIG. 2 is an enlarged view of a taper clutch portion and an end bearing portion of FIG. 1.
Figure 3:
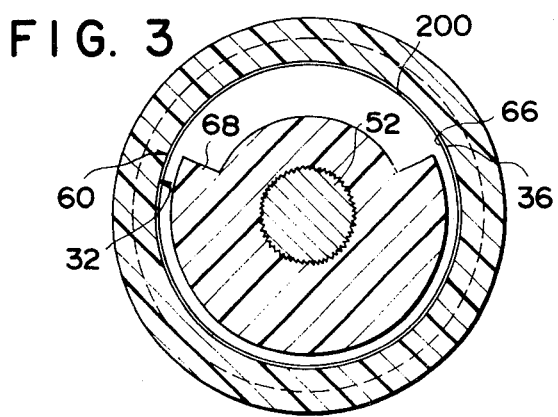
FIG. 3 is a cross sectional view taken along with the line of FIG. 2.
Figure 4:
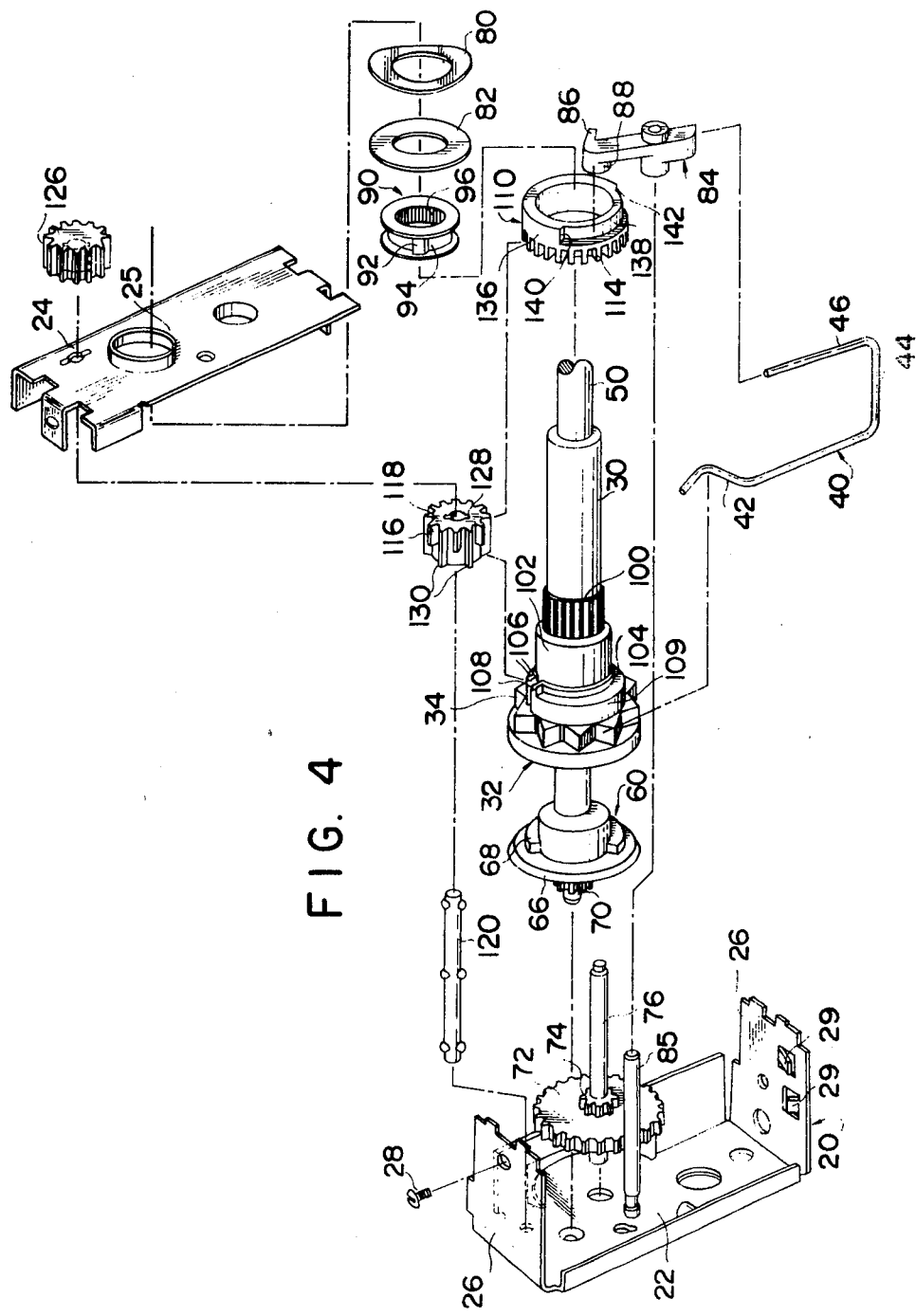
FIG. 4 is an exploded perspective view of the shaft mounting arrangement of FIG. 1.

Referring now to the drawing, the drive shaft arrangement of the UHF tuning mechanism of the present invention is therein illustrated in conjunction with a UHF tuner 10 of the continuously variable type having a main tuning shaft 12 rotation of which over an arc of approximately 180° is effective selectively to receive any one of channels assigned to such as the seventy of U.S. or fifty of Japanese UHF television stations. The arrangement includes a detent selector shaft 30, a fine tuning shaft 50 and a ring member 90 for counter stopping means, and such mechanism is mounted within a bracket 20 comprising a main rear wall 22, a front wall 24 and a pair of side walls 26, and secured together by means of the screws 28. The UHF tuner 10 is solidly mounted to the rear wall 22 of the bracket 20. The selector shaft 30 which is journaled in the opening formed by a forwardly directed flange 25 of the front wall 24 of the bracket 20 of the tuner drive mechanism. The fine tuning shaft 50 is positioned inside the selector shaft 30 and a hub member 60 is secured to the knurled portion 52 of the fine tuning shaft 50. The hub member 60 is provided with a tapered end bearing portion 62 which fits over taper edge 56 of the end portion 54 of the fine tuning shaft 50 and is journaled in the opening formed by a rearwardly directed flange 23 formed in the rear wall 22 of the bracket. An output drive gear 70 is formed integrally with the hub member 60 and is connected by means of suitable gearing 72 and 74 on an idle shaft 76 and a driven gear 78 to the main tuning shaft 12 of a continuously variable UHF tuner 10.

The selector shaft 30 is detented by means of a U-shaped detent spring 40 the V-shaped end portion 42 of which engages a series of ten lobes of a detent wheel 34 formed on the rearwardly extending hollow portion having a recess 32 at the rear end of the selector shaft 30. The U-shaped detent spring 40 is also provided with a bight portion 44 which is restrained between tongue portions 29 struck out on the side wall 26 of the bracket 20, and the other end portion 46 which engages a stop lever 84 mounted on a shaft 85 between the rear and front walls of the bracket 20, and acts as one part of the counter stopping means to be described in more detailed hereinafter.

In order to drive the gear 70 from the selector shaft 30, the hub member 60 is provided with an outwardly extending taper portion 66, the taper face of which acts as a first clutch face having an annular outer surface which opposes close to an inwardly extending taper portion 36 of the selector shaft 30. The taper portion 36 acts as a second clutch face having an annular inner surface within the recess 32 of the selector shaft 30. Each of surfaces has a coating layer 200 of lubricant materials such as of fluorine-contained resin and/or molybdemun disulfide.

The first and second clutch faces 66 and 36 are urged together by means of the bowed spring washer 80 which is positioned between the rear face of the front wall 24 of the bracket 20 and a flat washer 82 and which exerts a force to the selector shaft 30 so that the tapered end portion 62 of the hub member 60 is journaled in the opening formed in the rear wall 22 of the bracket 20 as described hereinbefore. When the bowed spring washer 80 exerts a rear-ward force on the selector shaft 30, a taper clutch is established by the first and second clutch faces 66 and 36, and rotation of the selector shaft 30 is transmitted through the taper clutch to the output drive gear 70 formed integrally with the cylinder portion 64 of the hub member 60. For obtaining a suitable friction in the taper clutch, a taper angle $2\theta$ is selected within the range below 90° and above 20° degrees, preferably within about 70° to 40°, and a lubricant layer 200 is disposed between the first and second clutch faces 66 and 36, preferably by spray coating of lubricant materials on each clutch faces. For example, in this embodiment wherein fine tuning torque of about 1.0 kilogram-centimeters and detent channel selecting torque of about 2.5 kilogram-centimeters are given in operation, the taper angle is selected at about 50 degrees by the use of spray coating of fluorine-contained resin and/or molybdemum disulfide lubricant materials for each clutching surfaces.

In the above arrangement, each one of the UHF channels is individually selected by manipulation of the selector shaft 30 through several revolutions. The selector shaft 30 is detented at ten different equally spaced positions by means of the detent wheel 34 and the detent spring 40 so that the selector shaft 30 may be used directly as a units dial drive member while at the same time functioning as a station selector member. Counter mechanism is also employed which includes the arming cam member 110 which is rotatably mounted on the selector shaft 30, the arming cam member 110 being employed to move a tens dial sleeve member 150 one increment for each revolution of the selector shaft so that the tens dial sleeve may be employed directly as a decade dial drive member, the units and tens digit dial members forming a composite display indicating digitally the channel number assigned to each UHF station selected by manipulation of the UHF selector shaft 30. In any detented UHF position, the fine tuning shaft 50 may be rotated independently of the selector shaft 30 through a limited arc by means of a knob secured to the front end of the shaft 50. The taper clutch formed by the member 36, 66 and 200 slips during this fine tuning operation.

In other words, when the fine tuning shaft is rotated, the hub member 60 rotates while the taper clutch slips since the selector shaft 30 is held in the detented UHF position by the detent spring 40, and accordingly the output drive gear 70 is rotated and provides a stepdown input to the main tuning shaft 22 so that the fine tuning shaft is moved very slightly to perform a precise UHF fine tuning function. In order to limit the amount of fine tuning range possible by rotation of the fine tuning shaft 50, there is provided a lug portion 38 within the recess 32 of the selector shaft 30, while the hub member 60 is provided with an arcuate flange portion 68 which is adapted to fit into the recess 32 and is of appropriate arcuate length to permit limited rotation of the fine tuning shaft 50 with respect to the selector shaft 30. When the fine tuning shaft 50 is rotated through an arc determined by the separation of the two ends of the shoulder of the arcuate flange portion 68, this shoulder engages the lug portion 38 and prevents further fine tuning movement of the fine tuning shaft 50 in that direction.

Considering now the counter-stop mechanism referred to briefly heretofore, the annular arming cam member 110 which is rotatably mounted on a rounded portion 102 of the selector shaft 30 has a series of gear teeth 114 which are in mesh with the short gear teeth 116 of a tripper gear member 118 which is mounted on a shaft 120 between the rear and front walls 22 and 24 of the bracket 20. The shaft 120 also carries a tens dial pinion gear 126 on the forward end thereof. The tripper gear 118 and the tens dial gear 126 are secured on the shaft 120 at the predetermined portions of the shaft 120 so that the gears 118 and 126 rotate together.

The arming cam member 110 is moved one step or increment for each revolution of the selector shaft 30 and controls the position of the stop lever 84 so that this lever is moved to an arming position adjacent each end of the UHF band. More particularly, the selector shaft 30 is provided with an annular groove 104 which terminates in a pair of radially extending web portions 106, the space between the web portions 106 forming a deep groove 108 which is adapted to act as a one-toothed gear when it receives one of the long gear teeth 130 provided on the tripper gear member 118, the long gear teeth 130 being extensions of every alternate one of the short gear teeth 116. A pair of adjacent ones of the long gear teeth 130 of the tripper gear 118 normally ride on the annular peripheral portion 109 of the selector shaft 30. However, when the web portions 106 are moved into engagement with one of the short gear teeth 116, the tripper gear 118 is moved one increment so that the next adjacent pair of long teeth 130 are in engagement with the annular surface, one of the teeth 130 entering the groove 108 as this movement of the gear 118 is accomplished. The arming cam member 110 is thus rotated one increment for each full revolution of the selector shaft 30 and remains in the incremented position during the succeeding revolution of the shaft 30 because the long gear teeth 130 ride on the annular surface. The shaft 120 is thus restrained at different incremental positions corresponding to the tens digit of the channel number of the received UHF stations.

The stop lever 84 is provided with an arming lobe portion 88 which normally rides on the outer peripheral portion 136 of the arming cam member 110. However, the peripheral portion 136 does not extend completely around the cam member 110 since the member 110 is provided with an arcuate portion 138 of reduced radius defined by the shoulders 140 and 142. The stop lever 84 is also provided with a stop lobe portion 86 which is somewhat longer than the arming lobe portion 88 and is positioned in alignment with the ring member 90 for counter stopping means.

One of features of the present invention is to employ the ring member 90 of the bobbin shape which is provided with a stop lug 92, a cam surface 94 on the outer periphery, and a knurled surface 94 of the inside face. This ring member 90 is fixed to the knurled portion 100 of the selector shaft 30 by mesh engagement with the knurled surface 96 removably so that the position of the stop lug 92 is changed optionally in accordance with the assignment of UHF channels. Thus, the selector shaft 30 is commonly used for different channel plans in every countries, such as the both of seventy channels in U.S. and fifty channels in Japan.

In operation of the above counter stopping means, the stop lobe portion 86 of the stop lever 84 does not extend downwardly to engage the stop lug 92 or the cam surface 94 of the ring member 90 during periods when the arming lobe portion 88 rides on the periphery 136 of the arming cam member 110. However, when the arming cam member 110 is moved by the tripper gear member 118, the arming lobe portion 88 is moved off of the shoulder 142 and the stop lobe portion 86 of the stop lever 84 is urged into engagement with the cam surface 94 of the ring member 90 due to the biasing force of the other end portion 46.

As the selector shaft 30 is rotated, the stop lobe portion 86 rides inwardly along the cam surface 94 so that when an attempt is made to rotate the selector shaft 30 further in the clockwise direction, the stop lug 92 is moved into engagement with the stop lobe portion 86 and further movement of the selector shaft 30 in this direction is positively prevented. A similar action occurs near the other end of the UHF band when the arming lobe portion 88 is moved off of the shoulder 140 and thereafter permits the stop lobe portion 86 to ride inwardly along the cam surface 94 on the other side of the stop lug 92 as the selector shaft is moved. As a result, positive limiting or stop action of the selector shaft 30 is provided in both directions at each end of movement of the selector shaft 30 required to cover the entire UHF television band. In this connection it will be noted that the stopping position of the selector shaft 30 is optionally adjusted by the use of the ring member 90.

In accordance with the present invention, a simple and inexpensive structure for shaft mounting arrangement is provided by using taper clutching means and/or counter stopping means. Particularly, since the necessary friction between clutch faces is controlled by the taper angle and if necessary by the lubricant coating, tuning operation by the operator is made more stably and easily as compared with the conventional clutch having a clutch pad. Further, the creeping action is also eliminated completely in the present invention and the mounting operation is improved by reducing a number of assemble parts.

What is claimed is:

1. A channel selecting device for a UHF tuner having a continuously variable main tuning shaft rotation of which is effective selectively to receive signals from all television stations in the UHF television band, which comprises; a selector shaft; a detent wheel secured to said selector shaft and having a series of lobes in the periphery thereof; spring detent means adapted to engage the lobes of said wheel for establishing a plurality of equally spaced detent positions for said selector shaft; a fine tuning shaft positioned inside said selector shaft; a drive gear secured to said fine tuning shaft; gear means for interconnecting said drive gear and said main tuning shaft; padless clutch means for transmitting rotation of said selector shaft to said drive gear while permitting rotation of said fine tuning shaft independently of said selector shaft when said selector is restrained by said detent means, said clutch means including a first padless taper portion on a hub member secured to said fine tuning shaft and a second padless taper portion on a hollow portion formed in said selector shaft; and clutch biasing means for exerting a force along the axes of said shafts to urge said first taper portion and said second taper portion to frictionally engage one another so as to align said selector shaft with said fine tuning shaft.

2. The device of claim 1, wherein said clutch means further including a lubricant layer disposed intermediate said first taper portion and said second taper portion for reducing a coefficient of friction therebetween so that the differential torque between the dynamic torque and the static torque for said fine tuning shaft is reduced to stabilize operation of said shafts, whereby said lubricant layer constitutes the only material interposed between said first and second taper portions.

3. The device of claim 2, wherein said lubricant layer comprises a coating of solid lubricant materials on each of said taper portions.

4. The device of claim 2, wherein said lubricant layer is formed by a spray coating of at least one of materials selected from a group consisting of fluorine-contained resin and molybdenum disulfide.

5. The device of claim 1, wherein said taper portion of said clutch means have a taper angle from about 20° to about 90°.

6. The device of claim 1, wherein said clutch means has a solid lubricant layer between said first and second taper portions, each of said taper portions has an angle to the centered axis of said shafts with an incline of less than about 45° and more than about 10°.

7. The device of claim 1, wherein said hollow portion of said selector shaft is formed in an end thereof, said second taper portion is formed by an annular inner surface of said hollow portion, said hub member on said fine tuning shaft is formed integrally with said drive gear, and said first taper portion is formed by an annular outer surface of said hub member.

8. The combination of a UHF tuner having a continuously variable main tuning shaft, a selector shaft provided with a series of detent lobes on the periphery and a recess in the rear end thereof, a detent biasing means for establishing a plurality of equally spaced detent positions for said selector shaft, a fine tuning shaft rotatably positioned inside said selector shaft, a hub member having an output gear and secured to said fine tuning shaft, a series of gear trains for interconnecting said output gear and said main tuning shaft; a padless taper clutch formed by the inner surface of said recess of said selector shaft and the outer surface of said hub member of said fine tuning shaft, and spring means for exerting a force along the axes of said shafts tending to bias said inner and outer surfaces of said padless taper clutch into engagement with one another to eliminate misalignment of said selector shaft with respect to said fine tuning shaft.

9. The combination of claim 8, wherein said hub member is provided with a forwardly extending portion for said taper clutch, an intermediate cylinder portion for said output gear, and a rear end bearing portion having a tapered surface, said fine tuning shaft is journaled at said tapered surface of said end bearing portion on the conical-shaped rearwardly directed flange of a rear wall of a bracket, and said spring means also exerts a force tending to hold said end bearing portion against said rear wall of said bracket.

10. The combination of claim 9, wherein said hub member is made of plastic material and secured to an end portion having a taper edge, of said fine tuning shaft to hold said bearing portion rigidly by contacting said tapered surface of said plastic hub member with the conical-shaped opening of said rearwall of said bracket.

11. The combination of claim 10, wherein said tapered surface of said end bearing portion of said hub member and said first and second taper portions of said clutch taper are sprayed with lubricant material so as to form a lubricant layer for performing smooth and stable fine tuning operation.

12. The combination of claim 9, wherein the taper angle of said taper clutch is in the range of about 20° to about 90° and said inner and outer surface are provided with a coating layer of lubricant materials such as fluorine-contained resin and/or molybdenum disulfide.

13. The combination of a UHF tuner having a continuously variable main tuning shaft, a selector shaft provided with a series of detent lobes on the periphery and a recess in the rear end thereof, a detent biasing means for establishing a plurality of equally spaced detent positions for said selector shaft, a fine tuning shaft positioned inside said selector shaft, a hub member having an output gear and secured to said fine tuning shaft, a series of gear trains for interconnecting said output gear and said main tuning shaft; a taper clutch formed by the inner surface of said recess of said selector shaft and the outer surface of said hub member of said fine tuning shaft, and spring means for exerting a force along the axes of said shafts tending to bias said inner and outer surfaces of said taper clutch to eliminate misalignment of said selector shaft with respect to said fine tuning shaft, and further including a counter-stop mechanism comprising a ring-shaped stop member defining a limit stop, an annular arming cam member concentric with and rotatably mounted on said selector shaft, means for rotating said cam member a predetermined increment for each revolution of said selector shaft, a stop lever having a first portion adapted to engage said cam member and a second portion adapted to engage said limit stop, and means for biasing said first portion of said stop lever into engagement with said cam member, said cam member having a first area in which said second portion of said stop lever is held out of engagement with said limit stop as said selector shaft is rotated and a second area in which said second portion of said stop lever is positioned to engage in said limit stop, and said stop member is removably fixed on said selector shaft so as to adjust the position of said limit stop due to the range of the predetermined UHF television band.

14. The combination of claim 13, wherein the inside of said ring-shaped stop member has a knurling, and said selector shaft has a knurled portion for adapting said stop member so that said stop member is removably mounted on said selector shaft in regards with the direction of its axis and is prevent from rotation thereof on said selector shaft.

15. The combination of claim 14, wherein the taper angle of said taper clutch is in the range of 40° and 70°, each of clutch surfaces having a lubricant layer formed by spraying lubricant materials, and the torques for rotations of said selector shaft and said fine tuning shaft are selected respectively within ranges of 2.0 to 4.5 kilogram-centimeters for said selector shaft and of 0.5 to 2.0 kilogram-centimeter for said fine tuning shaft.

* * * * *